US008598874B2

(12) United States Patent
Saes et al.

(10) Patent No.: US 8,598,874 B2
(45) Date of Patent: Dec. 3, 2013

(54) WIRELESS TRANSMIT AND RECEIVE MRI COILS

(75) Inventors: Marc Paul Saes, Beek en Donk (NL); Marinus Johannes Adrianus Maria van Helvoort, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 719 days.

(21) Appl. No.: 12/808,409

(22) PCT Filed: Dec. 22, 2008

(86) PCT No.: PCT/IB2008/055480
§ 371 (c)(1),
(2), (4) Date: Jun. 16, 2010

(87) PCT Pub. No.: WO2009/081378
PCT Pub. Date: Jul. 2, 2009

(65) Prior Publication Data
US 2010/0308826 A1    Dec. 9, 2010

(30) Foreign Application Priority Data

Dec. 21, 2007   (EP) ..................................... 07123896

(51) Int. Cl.
*G01V 3/00*     (2006.01)
*G01R 33/36*   (2006.01)

(52) U.S. Cl.
USPC ............................ 324/309; 324/307; 324/322

(58) Field of Classification Search
USPC ............................ 324/300–322; 600/407–465
See application file for complete search history.

(56) References Cited

U.S. PATENT DOCUMENTS

| 6,577,893 | B1 | 6/2003 | Besson et al. | |
| 6,961,604 | B1* | 11/2005 | Vahasalo et al. | 600/410 |
| 7,391,214 | B2* | 6/2008 | Adachi | 324/318 |
| 7,443,165 | B2* | 10/2008 | Varjo | 324/322 |
| 2006/0226841 | A1 | 10/2006 | Boskamp et al. | |
| 2007/0176601 | A1 | 8/2007 | Adachi | |
| 2009/0322335 | A1* | 12/2009 | Adachi et al. | 324/318 |
| 2012/0313645 | A1* | 12/2012 | Biber et al. | 324/322 |

FOREIGN PATENT DOCUMENTS

| EP | 0823639 A1 | 2/1998 |
| WO | 03032002 A1 | 4/2003 |
| WO | 2006008665 A1 | 1/2006 |
| WO | 2006048816 A1 | 5/2006 |
| WO | 2006067682 * | 6/2006 |

(Continued)

OTHER PUBLICATIONS

By D.I. Hoult et al.; "Designing a Transmitter and Receiver for Use in Strong Magnetic Fields" Proc. Intl. Soc. Mag. Reson. Med. 2006, p. 2022.

(Continued)

*Primary Examiner* — Jermele M Hollington
*Assistant Examiner* — Emily Chan

(57) ABSTRACT

A magnetic resonance system includes a wireless local coil which functions as a transmit only or a transmit and receive coil. The local coil includes an RF coil with a plurality of coil elements. A corresponding number of transmit amplifiers apply RF signals to the RF coil elements to transmit an RF signal. A peak power supply provides electrical power to the transmit amplifiers to transmit relatively high power RF pulses. A trickle charging device recharges the peak power supply between RF pulses front a local coil power supply. A power transfer device wirelessly transfers power to a coil power supply recharging device which recharges the local coil power supply.

12 Claims, 2 Drawing Sheets

(56) References Cited

FOREIGN PATENT DOCUMENTS

| | | | |
|---|---|---|---|
| WO | 2007072438 | A2 | 6/2007 |
| WO | 2007072438 | A3 | 6/2007 |
| WO | 2007100696 | A2 | 9/2007 |
| WO | 2007100696 | A3 | 9/2007 |

OTHER PUBLICATIONS

By P. H. Wardenier et al.; "Integrating Amplifiers in Transmit-and Receive-Coils" Book of Abstracts of the Meeting and Exhibition of the Society of Magnetic Resonance in Medicine, San Francisco, Aug. 20-26, 1988 pp. 840.

* cited by examiner

WIRELESS TRANSMIT AND RECEIVE MRI COILS

FIELD OF THE INVENTION

The present application relates to the magnetic resonance arts. It finds particular application in conjunction with diagnostic imaging on subjects and will be described with particular reference thereto. However, it is to be appreciated, that the concepts described below will also have other applications such as magnetic resonance spectroscopy, preclinical imaging, and the like.

BACKGROUND OF THE INVENTION

In magnetic resonance imaging, the patient is placed in a main magnetic field, also called $B_0$ magnetic field. High power radiofrequency signals are transmitted into the patient to excite dipoles in the subject to resonate and to manipulate selected dipoles. Low power signals from the resonating dipoles are received and processed. In magnetic resonance imaging, magnetic field gradients are applied across the imaged region to encode spatial position in the resonance, e.g. by phase or frequency encoding.

In many applications, it is advantageous to place the radiofrequency transmit coils and/or the radiofrequency receive coils as close to the region of the subject to be imaged as possible. To this end, a variety of local coils have been developed, such as head coils, spine coils, surface coils, and a variety of other coils which are positioned on or close to a surface of the patient adjacent the region to be imaged. The receive coils are connected by cables with the remainder of the system in order to receive power for preamplifiers, and other electronic components that process received signals, as well as for carrying control signals for controlling the coil, and for carrying the received magnetic resonance signals. The cables carry RF pulses from RF transmitters to the transmit portion of the coil. The cables leading to and from the transmit and receive coils have numerous drawbacks such as subject discomfort, inconvenience during setup, and reducing patient throughput. Moreover, the RF fields could induce currents in these cables which could burn or injure the subject, damage electronic components on the transmit or receive coils, reduce image quality, and the like.

In an effort to reduce this cabling, there have been numerous proposals for wireless receive coils. Receive coils have very modest power requirements for preamplifiers, analog to digital converters, and other relatively low power consuming electronics. Typically, a few watts of power are sufficient for powering wireless receive coils. Whole body RF transmit coils built into the bore are often used to excite and manipulate resonance while the resonance signals are received by a wireless receive coil. Local transmit coils which transmit RF pulses on the order of a couple of kilowatts per pulse are generally considered too power consumptive to be made wireless.

It is an object of the present application to provide a wireless transmit, or transmit and receive RF coil for magnetic resonance studies.

SUMMARY OF THE INVENTION

In accordance with one aspect of the present application, a local coil for a magnetic resonance system is provided. The local coil includes an RF coil with one or more coil elements. At least one transmit amplifier applies RF signals to the RF coil to transmit an RF signal. A peak power supply provides pulses of electrical power to the transmit amplifier. A charging device charges the peak power supply from a local coil power supply.

In accordance with another aspect, a magnetic resonance method is provided. RF pulses are transmitted into an examination region with a wireless local coil to excite and manipulate resonance. Magnetic resonance signals are received and reconstructed into an image for conversion into a human readable display.

One advantage resides in an elimination or reduction of cables running to local coils.

Another advantage resides in improved patient safety.

Another advantage resides in simplified set-up procedures and improved patient throughput.

Still further advantages will become apparent upon reading and understanding the following detailed description.

BRIEF DESCRIPTION OF THE DRAWINGS

These and other aspects will be described in detail hereinafter, by way of example, on the basis of the following embodiments, with reference to the accompanying drawings, wherein.

Corresponding reference numerals when used in the various figures represent corresponding elements in the figures.

DETAILED DESCRIPTION OF EMBODIMENTS

Figure 1:
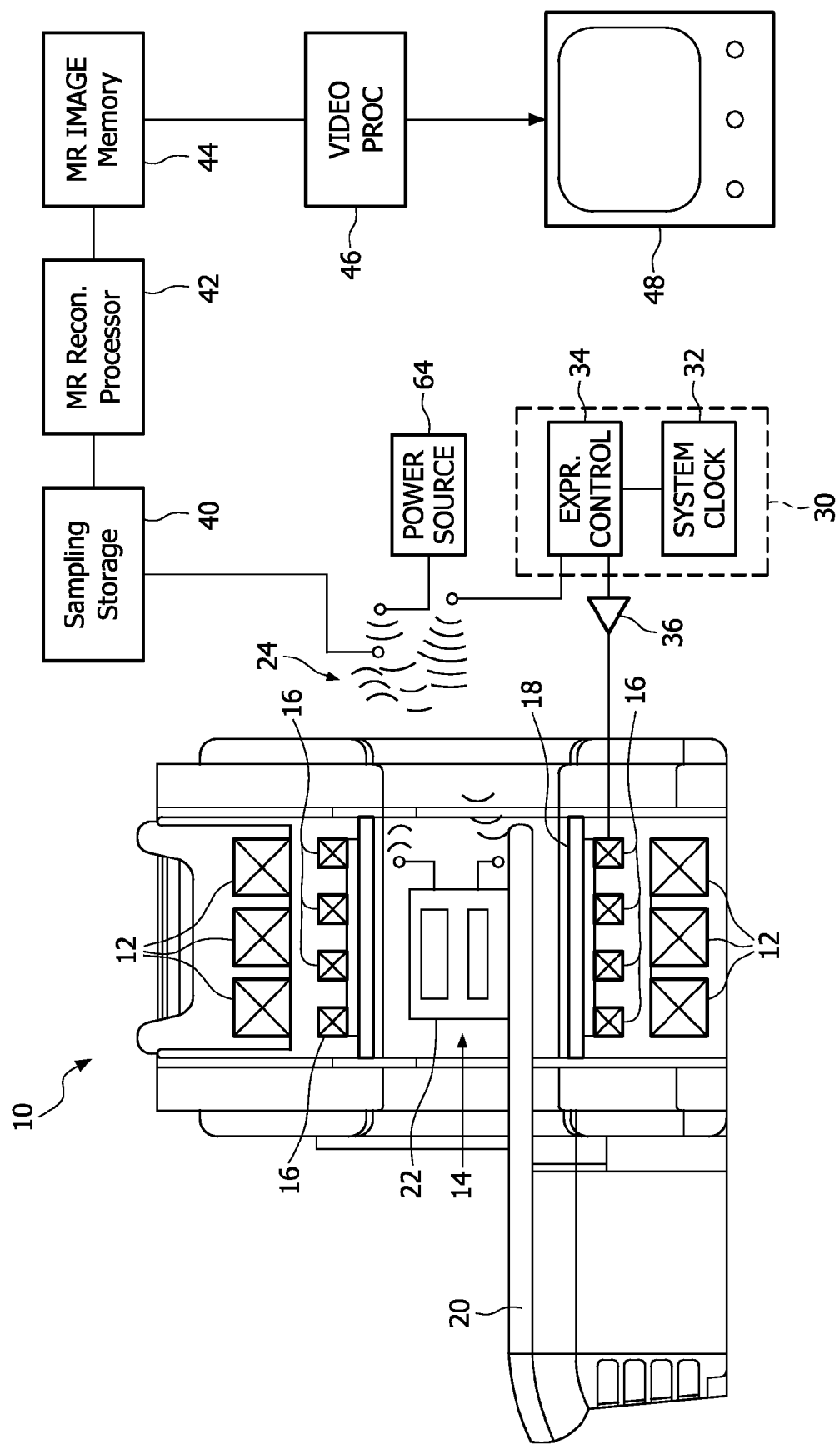
FIG. 1 is a diagrammatic illustration of a magnetic resonance imaging system.

With reference to FIG. 1, a magnetic resonance imaging system 10 includes a main magnet 12, such as a superconducting magnet, which generates a main or $B_0$ magnetic field through an examination region 14. Although the examination region is illustrated as a bore, open magnet systems, C magnet systems, four post magnet systems, and the like are also contemplated. Gradient magnetic field coils 16 generate magnetic field gradients or gradient pulses across the examination region, typically along three orthogonal directions. Optionally, a whole-body RF coil 18 transmits RF pulses into the examination region 14 and receives magnetic resonance RF signals from the examination region.

A subject support or pallet 20 selectively moves a subject (not illustrated) into and out of the examination region 14. A local coil 22, a head coil in the illustrated embodiment, is positioned in the examination region in close proximity to the subject. Various local coils, such as a head coil, neck coil, shoulder coil, spine coil, surface coil, knee coil, insertable catheter, and the like are also contemplated. A lossy medium 24 wirelessly transfers power and information between the local coil 22 and portions of the system which are disposed outside of the examination region.

A system controller 30 includes system clock 32 and experiment control 34 which provides appropriate control signals for implementing a selected magnetic resonance sequence. Control signals are provided to gradient amplifiers 36 which are connected by wire with the whole body gradient coils 16. The system control 30 is also connected by wire with the optional whole body RF coil 18. Further, the system controller is connected to the wireless or other lossy medium 24 for communicating instructions to the transmit coil portion of the local coil 22.

A sampling buffer or storage device 40 is connected with the wireless or lossy medium 24 for wirelessly receiving resonance signals from the receive coil section of the local coil 22. A magnetic resonance reconstruction processor 42 reconstructs the received signals into a volume magnetic resonance image representation which is stored in an MR image memory 44. A video processor 46 converts portions of the volume image representation into appropriate format for display on a monitor 48 as slice images, volume renderings, and the like.

Figure 2:
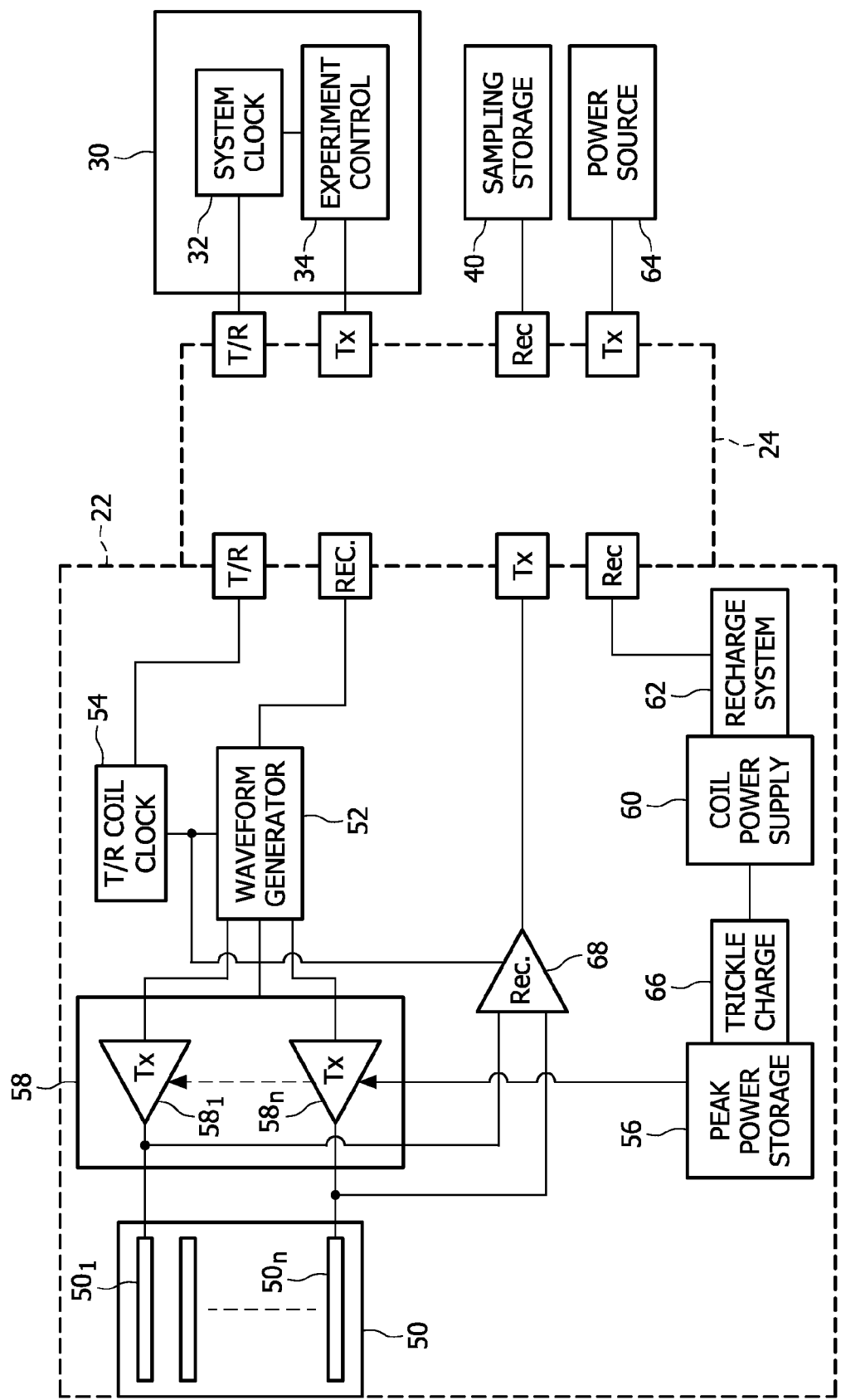
FIG. 2 illustrates a circuit for supplying power to and communicating with the transmit coil shown in FIG. 1.

With reference also to FIG. 2, the local coil 22 includes a transmit coil 50 which, optionally, is also used as a receive coil. When the transmit coil is to transmit an RF pulse, appropriate control signals are sent from the system control 30 via the lossy medium 24 to a waveform generator 52 on the local coil 22. With timing provided on the local coil by a transmit/receive coil clock 54 and power received from a peak power storage device 56, a transmit amplifier 58 is caused to apply the appropriate RF pulses to the transmit coil 50.

In one embodiment, the RF transmit coil 50 includes a plurality of individual transmit rods or other individually operated coil elements $50_1, \ldots 50_n$. Analogously, the transmit amplifier 58 includes a plurality of distributed amplifiers $58_1, \ldots 58_n$ such that each transmit rod or coil element is controlled individually, i.e. a multi-transmit mode. This allows each amplifier to be implemented with a single power stage which eliminates large, power consuming combination filters. This multi-transmit approach also provides the advantage of shaping the transmit field more precisely. In this combination, the power applied varies with the local coil. In a head coil, for example, the peak demand is about 2 kW. However, the peak power is only demanded for a fraction of each repetition of the magnetic resonance pulse sequence or, on the order of about 1% of the acquisition interval. Thus, the average power consumed over the entire acquisition interval is in the range of about 20-30 watts.

A coil power supply 60 is configured to supply the average power requirement for the transmit or transmit and receive coil, e.g. about 30 watts. The coil power supply 60 can take various forms, such as a battery, rechargeable batteries which are recharged between deployments of the transmit/receive coil on a charging station, rechargeable batteries that are recharged wirelessly and the like. In the illustrated embodiment, an onboard recharging system 62 is provided, such as a gradient field tapping system, i.e. coils in which current is induced by the applied magnetic field gradients, which current is used to recharge a rechargeable battery, capacitor, or the like of the coil power supply 60. In another embodiment, the RF field is tapped, particularly the RF field from the whole body RF coil 18. In another embodiment, the charging current is provided via a wireless link, e.g. by inductive, capacitive, or RF power transfer from an external power source 64 to the recharging system 62.

A trickle or other charging circuit 66 receives power from the coil power supply 60 and uses it to charge the peak power storage device 56 that is capable of meeting the above described peak power delivery requirements over a large number of transmit/reload cycles. Various peak power storage devices are contemplated, such as super capacitors that can be charged slowly and are able to quickly release their charge. The coil power supply 60 further powers the waveform generator 52, the clock 54, a preamplifier 68 for received magnetic resonance signals, and other electronic components located on the local coil 22, e.g. transmit/receive units for communicating over the wireless or lossy medium.

The control of the transmit amplifier 58 is run wirelessly, such as via fiber optics, RF signals, digital or digitally modulated RF or other light spectra, and the like, of the lossy medium 24. Clock signals from the master clock 32 in the system controller 30 can be carried with other selected sequence control parameters from the MR experiment control 34 and the like. A time stretch control is decoupled with FIFOs and can deal with a certain level of data loss. However, the quality of service (QoS) over a wireless connection transmitted through the atmosphere is more prone to temporary, large variations. In order to resolve the control part of this quality of service issue, the control/status FIFO can be enlarged to deal with larger communication outages. However, this has the consequence of a longer feedback cycle in the case of a scan with feedback. Another method is to control the data bandwidth by parameterization and scripting the control over time and generating the waveforms for the transmit RF on the local coil. The transmit receive units of the lossy medium increase the bandwidths when the signal clarity is high and reduce the bandwidth when signal clarity is low.

With a distribution of the clock on the data stream, temporary, unpredictable link outages may occur due to spikes, reflections, or other wireless link disturbances. In one embodiment, the link outages are dealt with using a higher level strategy, e.g. on the basis of key real-time wireless channel characteristics, deciding whether to feedback additional data transition edges to a phase lock loop or to have a local coil oscillator run freely until wireless channel conditions improve.

In another embodiment, the local coil clock 54 of the local transmit/receive coil 22 becomes the master clock and the system clock 32 of the system controller 30 functions as a slave to the local coil master clock. This leads to more relaxed specifications for clock jitter because the gradient field has a much more relaxed specification toward the RF field, versus specifications for matching the RF receive and transmit. This assures that the timing between the RF transmit and resonance frequency sampling is precisely maintained, on the order of picoseconds, although the timing relative to the gradient magnetic field pulses may slip, e.g. be accurate only on the order of microseconds. Thus, when the local coil 22 is used as a transmit/receive coil, the coil clock 54 becomes the master clock for the system. However, when receive-only local coils are used in combination with the whole body transmit coil 18, the system clock 32 can remain the master clock with the receive coil clock functioning as a slave clock locked to it. This method relaxes the clock jitter timing requirements between the system and the transmit/receive coil.

When used as a transmit/receive coil, the coil 50 also functions as a receive coil. Reversed resonance signals are preamplified by the preamplifier 68 and communicated across the lossy medium to the sampling buffer 40. When the coil 50 has a plurality of independently controllable elements $50_1, 50_2 \ldots 50_n$, a similar number of preamplifiers are provided. The resonance signals from the individual coil elements can each be transmitted across the lossy medium for combination prior to reconstruction or can be combined on the local coil.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosed method can be implemented by means of hardware comprising several distinct elements, and by means of a suitably programmed computer. In the system claims enumerating several means, several of these means can be embodied by one and the same item of computer readable software or hardware. The mere fact that certain measures are recited in mutually different dependent claims does not indicate that a combination of these measures cannot be used to advantage.

The invention claimed is:

1. A local coil for a magnetic resonance system, the local coil comprising:
   an RF coil including one or more coil elements;
   at least one transmit amplifier which applies RF signals to the RF coil to transmit an RF signal;
   a peak power supply which provides pulses of electrical power to the transmit amplifier;
   a charging device which charges the peak power supply from a local coil power supply; and
   a lossy medium over which control signals from an MR system control are wirelessly communicated to circuitry on the local coil,
   wherein the circuitry includes a waveform generator for controlling waveforms generated by the transmit amplifier and a local coil clock.

2. The local coil according to claim 1, including:
   a coil power supply recharging unit which recharges the local coil power supply; and
   a power transfer device which wirelessly transfers power to the coil power supply recharging device.

3. The local coil according to claim 1, further including a preamplifier capable of amplifying magnetic resonance signals received on the coil elements, wherein the local clock is configured to function as a master clock to clock RF transmissions by the transmit amplifier and the reception of resonance signals by the preamplifier.

4. The local coil according to claim 3, wherein the local coil clock communicates across the lossy medium with a system clock such that the system clock functions as a slave clock to the local clock, the system clock controlling gradient coils.

5. A magnetic resonance imaging system comprising:
   a main magnet for generating a main magnetic field through an examination region;
   a gradient magnetic coil for applying magnetic field gradients across the examination region;
   the local coil according to claim 1; and
   a controller which controls the transmit amplifier of the local coil via the lossy medium and which controls the gradient coils.

6. The magnetic resonance imaging system according to claim 5, further including:
   a magnetic resonance reconstruction processor for reconstructing received magnetic resonance signals into a magnetic resonance image for display on a display device; and
   the local including a receive preamplifier which amplifies resonance signals received by the one or more coil elements and transmits the received resonance signals via the lossy medium to the magnetic resonance reconstruction processor.

7. A magnetic resonance method comprising:
   transmitting RF pulses into an examination region to excite or manipulate magnetic resonance using a wireless local coil;
   receiving magnetic resonance signals;
   reconstructing the received magnetic resonance signals into an image for conversion into a human viewable display; and
   clocking timing of transmission of transmitted RF signals and the receiving of magnetic resonance echoes with a local coil clock mounted on the local coil; and
   wirelessly transferring electrical power via a lossy medium to the wireless local coil to power at least one transmit amplifier.

8. The method according to claim 7, wherein the power is transferred wirelessly to a low wattage power supply on the local coil;
   trickle charging a peak power storage device with power from the low power storage device; and
   periodically using power from the peak power storage device to power the transmit amplifier to generate RF transmit pulses.

9. The magnetic resonance method according to claim 7, further including:
   monitoring transmission across the lossy medium; and
   adjusting a bandwidth with which signals are sent via the lossy medium in accordance with the monitored transmission.

10. The magnetic resonance method according to claim 7, further including:
    receiving magnetic resonance signals with one or more coil elements;
    amplifying the received magnetic resonance signals on the local coil; and
    transmitting the amplified resonance signals via the lossy medium to a reconstruction processor.

11. The magnetic resonance method according to claim 7, further including:
    applying gradient magnetic fields with timing controlled by a system clock disposed remote from the local coil; and,
    interconnecting the local coil clock and the system clock such that the local coil clock functions as a master clock and the system clock functions as a slave clock to the local coil master clock.

12. A non-transitory computer readable medium programmed with software that controls one or more processors of a magnetic resonance apparatus to implement the method according to claim 7.

* * * * *